United States Patent [19]

Bedoya

[11] Patent Number: 5,144,104
[45] Date of Patent: Sep. 1, 1992

[54] MINIATURE SWITCH DEVICE WITH TACTILE EFFECT

[75] Inventor: Claude Bedoya, Montigny-le-Bretonneux, France

[73] Assignee: Sextant Avionique, France

[21] Appl. No.: 673,926

[22] Filed: Mar. 25, 1991

[30] Foreign Application Priority Data

Mar. 30, 1990 [FR] France ............... 90 04065

[51] Int. Cl.$^5$ ............................................. H01H 1/10
[52] U.S. Cl. .............................. 200/512; 200/292; 200/406
[58] Field of Search .............. 200/512, 513, 514, 515, 200/516, 406, 292, 517, 54

[56] References Cited

U.S. PATENT DOCUMENTS

| | | | |
|---|---|---|---|
| 3,643,041 | 2/1972 | Jackson | 200/512 X |
| 3,749,859 | 7/1973 | Webb et al. | 200/516 X |
| 3,973,091 | 8/1976 | Kaminski | 200/5 A |
| 4,018,999 | 4/1977 | Robinson et al. | 200/516 X |
| 4,074,088 | 2/1978 | Keough et al. | 200/516 X |
| 4,083,100 | 4/1978 | Flint et al. | 200/517 X |
| 4,194,105 | 3/1980 | Hodges | 200/517 |
| 4,207,448 | 6/1980 | Furusawa et al. | 200/516 |
| 4,468,542 | 8/1984 | Pounds | 200/517 X |
| 4,659,881 | 4/1987 | Dowe | 200/516 X |
| 4,737,602 | 4/1988 | Yamamoto | 200/292 X |

FOREIGN PATENT DOCUMENTS

| | | | |
|---|---|---|---|
| 3229348 | 2/1984 | Fed. Rep. of Germany | 200/516 |
| 2430658 | 3/1980 | France | 200/521 |

*Primary Examiner*—Henry J. Recla
*Assistant Examiner*—Glen T. Barrett
*Attorney, Agent, or Firm*—William A. Drucker

[57] ABSTRACT

A miniature switch device with tactile effect is disclosed comprising a printed circuit board with two conducting areas cooperating with a cap in the form of a spherical skull cap made from an electrically conducting and resiliently deformable material, this cap being maintained in electric contact, by its periphery, with the first conducting area, and extending, at rest, above the second conducting area, the second conducting area having an annular shape bordering a central cavity formed in the printed circuit board.

4 Claims, 1 Drawing Sheet

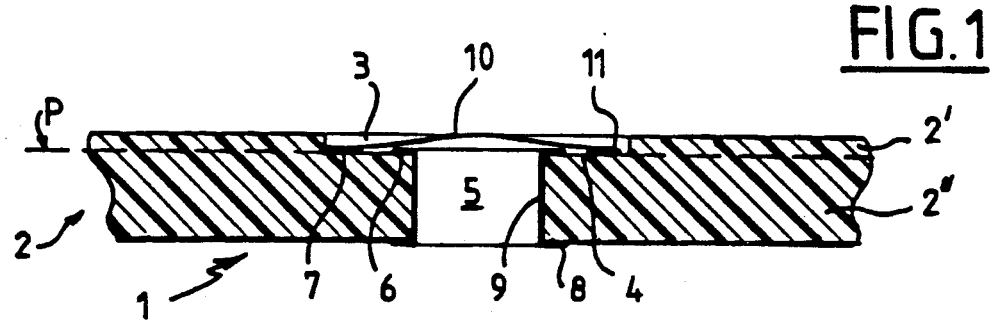
FIG.1
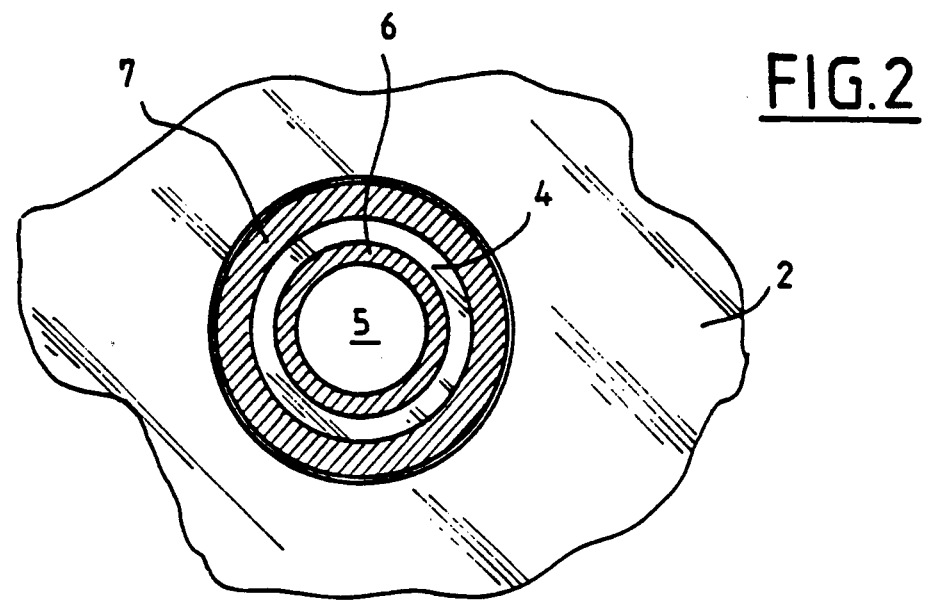
FIG.2
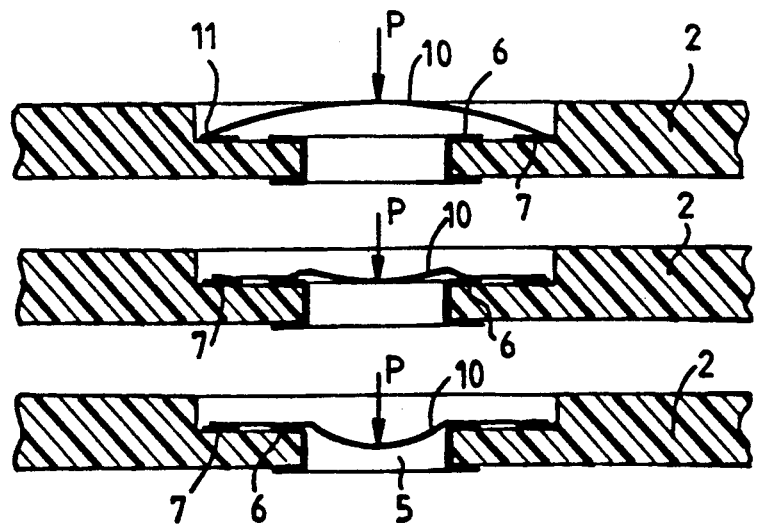
FIG. 3
FIG. 4
FIG. 5

MINIATURE SWITCH DEVICE WITH TACTILE EFFECT

BACKGROUND OF THE INVENTION

1. Field of the Invention

The present invention relates to a miniature switch device with tactile effect which can be integrated in a printed circuit, particularly for forming a keyboard with ultra flat keys.

2. Description of the Prior Art

Generally, switch devices have already been proposed, particularly by the patents U.S. Pat. Nos. 4,083,100, 4,468,542 and EP-A-0 100 875, forming electric contacts between conducting areas of the printed circuit by resilient deformation of metal caps in the form of skull caps.

Usually, each of these caps is placed on the printed circuit so as to be in electric contact by its periphery with a first conducting area and to extend above a second conducting area electrically isolated from the first one and placed substantially opposite the central zone of the cap, this second conducting area being formed conventionally of a metallized bore.

Connection of the cap to the printed circuit is then provided by three studs acting at three points on its periphery, 120° apart (cf U.S. Pat. No. 4,083,100).

It is obvious that by exerting on the cap a pressure oriented towards the printed circuit, deformation of this cap is caused until its central portion abuts at the end of travel against the second conducting area and provides its electric connection with the first conducting area.

However, such devices do not produce a tactile effect of the type usually desired in switches of this kind. In fact, the resistant force which the cap opposes to operation increases continuously until it exactly counterbalances this operating force, when the central portion of the cap abuts at the end of travel against the second conducting area.

This is why such devices require the use, in the connection between the cap and the key which is usually associated therewith, of relatively complex means, difficult to form and consequently expensive which are intended to produce the desired tactile effect.

The use of such means has the further drawback of appreciably increasing the thickness of the keyboard, which is contrary to the desired result.

SUMMARY OF THE INVENTION

The object of the invention is then to overcome such drawbacks. It provides a switch device of a type similar to that described above which produces a tactile effect without the use of special means in the connection between cap and pusher and which reduces the total thickness (printed circuit, cap, key) of the keyboard.

A further object is to provide a switch device with the following advantages :

no rebound,
better electric contact quality,
increased useful life.

It provides a switch device comprising, as mentioned above, a printed circuit with at least two conducting areas and a cap in the form of a substantially spherical skull cap maintained on the printed circuit so that it is in electric contact, by its periphery, with the first conducting area, whereas it extends above the second conducting area, the second conducting area having an annular shape substantially coaxial with said cap and bordering a cavity formed in said printed circuit.

According to the invention, this device is characterized in that the dimensions of the cap and those of the bore are determined so that, under the effect of an operating force, the central portion of the cap, after undergoing a reversal of concavity may be engaged in said central cavity.

Advantageously, the ratio between the circular base of the cap and the diameter of the cavity is close or equal to 3.

BRIEF DESCRIPTION OF THE DRAWINGS

One embodiment of the invention will be described hereafter, by way of example, with reference to the accompanying drawings in which :

FIG. 1 is a schematic cross sectional view of a switch device according to the invention;

FIG. 2 is a partial top view of the printed circuit used in the switch shown in FIG. 1, in a zone comprising a countersink at the bottom of which the contacts of the switch are disposed;

FIGS. 3, 4 and 5 are schematic cross sectional views showing a switch in the rest position (FIG. 3) , in the end of travel closed position (FIG. 4) and in the end of over-travel condition (FIG. 5).

DESCRIPTION OF THE PREFERRED EMBODIMENT

Such as shown in FIGS. 1 and 2, the switch device 1 is integrated in a printed circuit 2 comprising a cylindrical recess 3 (blind cavity) whose bottom 4 has a central coaxial throughbore 5.

The bottom 4 has two coaxial annular metallizations 6, 7 which form the two fixed contacts of the switch which it is desired to be connected electrically on demand, namely:

an annular metallization 7 substantially adjacent the cylindrical wall of recess 3, and
an annular metallization 6 bordering the central bore 5.

Of course, these metallizations 6, 7 are to be connected to electric and/or electronic circuits, possibly carried by the printed circuit 2, by conducting connections, not shown.

In this example, metallization 6 is connected electrically to a conducting area 8 carried by the lower face of the printed circuit 2 through a metallization 9 of the cylindrical wall of the central bore 5.

Advantageously, the printed circuit 2 may be made by superimposing two double faced printed circuit wafers 2', 2" fixed to each other, at the level of the plane p shown in FIG. 1 with broken lines, one of these wafers 2' having the recess(es) corresponding to the countersink(s)3, whereas wafer 2" has the throughbore(s) 5.

The element providing controllable electric connection between the two annular contacts consists of a resiliently deformable metal cap 10 in the form of a substantially spherical skull cap whose circular base 11 has a diameter substantially equal to the diameter of countersink 3. Preferably, the height of this cap 10 is at most equal to that of the countersink 3, so as to reduce as much as possible the thickness of the switch.

As can be seen in FIGS. 1 and 3, at rest, cap 10 disposed in countersink 3 bears, by its peripheral edge 11, on the metallized annular area 7, whereas its central portion extends above metallization 6. In this position, the two metallizations 6, 7 are isolated electrically from each other.

From this position, a pressure P exerted on the top of cap 10, in the direction of the metal area 6, will cause resilient deformation of cap 10 which, in a first stage (closure travel), will generate a resistant force which increases as a function of the amplitude of the deformation.

At the end of this closure travel, cap 10 is applied on the annular area 6 and thus provides electric contact between the two areas 6, 7.

The quality of this contact is increased because the cap bears on the circular edge of the metallization (circular contact).

Simultaneously, deformation of cap 10 reaches a critical point (FIG. 4) from which a reversal of concavity of the central portion of cap 10 occurs with an effect of release of the resistant force.

This reversal of concavity is made possible because of the presence of bore 5 in which the central portion of the cap extends.

At the end of reversal, the force applied no longer generates an appreciable deformation of cap 10 and is therefore compensated for by the resistant force.

As soon as the operating force ceases, cap 10 returns automatically to its rest position shown in FIGS. 1 and 3.

Tests carried out on a switch having a countersink of diameter $\phi 1 = 7$ mm, a throughbore of diameter $\phi = 2.5$ mm (ratio of 3 between the diameter of the circular base of the cap and the diameter of the adjacent bore) and a cap of the type commercialized under the trademark "SECME" gave excellent results, with a projection of the top of the cap with respect to the plane p of about 0.055 mm.

These tests have shown the following advantages:
no rebound,
better quality of the contact (circular) relatively to the contact (pinpoint) of existing solutions,
increased useful life (higher than $5.10^6$ operations), and
easier assembly, in particular positioning of the cap.

Of course, to these advantages is added that which results from the fact that the total thickness of the switch does not exceed that of the printed circuit 2.

The above described switch, which may be actuated by a conventional push-button, may be used individually or even in combination with other switches of the same kind, for example for forming a keyboard.

In the latter case, the different switches are formed, in a matrix configuration, on the same printed circuit board.

What is claimed is:

1. A switch device with tactile effect which comprises:
   i) a printed circuit board having a planar support surface, said planar support surface having located thereon an external annular conducting element having a first diameter and an internal annular conducting element, said internal annular conducting element being substantially coaxial with said external annular conducting element and bordering a central cavity formed in said board, said central cavity having a second diameter and a determined depth and
   ii) a continuously spherical skill cap made from an electrically conducting and resiliently deformable material said skull cap comprising a spherical central portion having a concavity which may be inverted under the effect of an operating force and a circular peripheral edge having a diameter substantially equal to said first diameter, such that said peripheral edge is maintained in electric contact with said external annular conducting element, wherein said first and second diameters are in ratio substantially equal to 3 so that, after undergoing a reversal of concavity under the effect of said operating force, said spherical central portion is engaged in said central cavity and bears on a circular edge of the internal annular conducting element.

2. The device as claimed in claim 1, wherein said planar support surface consists of a bottom of a cylindrical cavity formed in the printed circuit board said cylindrical cavity having a depth and diameter substantially equal to said first diameter.

3. The device as claimed in claim 2, wherein the cap has a height at most equal to the depth of said cylindrical cavity.

4. The device as claimed in claim 2, wherein the printed circuit board consists of the superimposition of two printed circuit wafers, one of which has at least one recess corresponding to the cylindrical cavity and the other comprises a throughbore placed coaxially to said cavity.

* * * * *